United States Patent
Grise et al.

(10) Patent No.: US 7,721,170 B2
(45) Date of Patent: May 18, 2010

(54) APPARATUS AND METHOD FOR SELECTIVELY IMPLEMENTING LAUNCH OFF SCAN CAPABILITY IN AT SPEED TESTING

(75) Inventors: Gary D. Grise, Colchester, VT (US); Vikram Iyengar, South Burlington, VT (US); David E. Lackey, Jericho, VT (US); Mark R. Taylor, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 11/874,972

(22) Filed: Oct. 19, 2007

(65) Prior Publication Data
US 2009/0106608 A1 Apr. 23, 2009

(51) Int. Cl.
*G01R 31/28* (2006.01)
(52) U.S. Cl. .......................... 714/726; 714/731; 714/30; 714/34; 714/727; 714/729; 714/734; 714/744
(58) Field of Classification Search ........................ None
See application file for complete search history.

(56) References Cited

U.S. PATENT DOCUMENTS

| | | | | |
|---|---|---|---|---|
| 5,973,529 A | * | 10/1999 | Chappell et al. ............ | 327/200 |
| 6,448,835 B1 | * | 9/2002 | Douskey et al. ............. | 327/295 |
| 6,539,497 B2 | * | 3/2003 | Swoboda et al. ............. | 714/30 |
| 6,662,324 B1 | | 12/2003 | Motika et al. | |
| 6,877,123 B2 | * | 4/2005 | Johnston et al. ............. | 714/731 |
| 7,058,866 B2 | | 6/2006 | Flanagan et al. | |
| 2003/0084390 A1 | * | 5/2003 | Tamarapalli et al. ........ | 714/744 |
| 2003/0204800 A1 | * | 10/2003 | Flanagan et al. ............ | 714/726 |
| 2005/0204244 A1 | | 9/2005 | Ashton et al. | |
| 2006/0208783 A1 | * | 9/2006 | Lackey et al. ............... | 327/202 |
| 2009/0037786 A1 | * | 2/2009 | Wang et al. .................. | 714/731 |

* cited by examiner

*Primary Examiner*—John P Trimmings
(74) *Attorney, Agent, or Firm*—Cantor Colburn LLP; Michael LeStrange

(57) ABSTRACT

An apparatus for selectively implementing launch-off-scan capability in at-speed testing of integrated circuit devices includes a control device configured to selectively disable a master clock signal of a latch structure under test such that a pulse sequence of a system clock signal results in a slave-master-slave clock pulse sequence in the latch structure under test; wherein the control device utilizes the system clock signal as an input thereto and operates in a self-resetting fashion that is timing independent with respect to a scan chain.

14 Claims, 20 Drawing Sheets

ASSTLOS1 - Toggle Control
ASSTLOS2 - Flush Control

| Mode | Operation | ASST | LOS | TGSTATE | S | R | L1 | L2 |
|---|---|---|---|---|---|---|---|---|
| Mission | Latch is set | 0 | 0 | 0 | 1 | 0 | 1 | 1 |
| LSSD | Latch is set | 0 | 0 | 0 | 1 | 0 | 1 | 1 |
| ASST LOC | Latch is set | 1 | 0 | X | 1 | 0 | 1 | 1 |
| ASST scan | Latch is set | 1 | 0 | 0 | 1 | 0 | 1 | 1 |
| ASST scan to LOS | Latch is reset | 1 | 1 | 0 | 0 | 1 | 0 | 0 |
| ASST LOS | L2 is set by rising OSC | 1 | 1 | 1 | 0 | 0 | 1 | 0→1 |

Fig. 9

| L1GATER pin | System | Scan / LSSD testing | Operational Mode | | |
|---|---|---|---|---|---|
| | | | Scan -> L/C transition sequence | L/C sequence | L/C->Scan transition sequence |
| C | 1 | LSSD C | 0001 | 1 | 1000 |
| ASSTLOS1 | 0 | 0 | 0011 | 1 | 1100 |
| ASSTLOS2 | 0 | 0 | 0111 | 1 | 1110 |
| E | d/c | d/c | 0000 | 0 1 0 1 0 0 | 0000 |
| Flop State (ZC) | Flush (1) | Flush (LSSD C) | 0000 | 0 1 1 0 0 0 | 0000 |

When ASSTLOS2=0, latches flush
When ASSTLOS2=1, latches operate as negedge flop

When ASSTLOS2=0, latches flush
When ASSTLOS2=1, latches operate as posedge flop

APPARATUS AND METHOD FOR SELECTIVELY IMPLEMENTING LAUNCH OFF SCAN CAPABILITY IN AT SPEED TESTING

BACKGROUND

The present invention relates generally to integrated circuit testing techniques and, more particularly, to an apparatus and method for selectively implementing launch-off-scan capability in at-speed testing of integrated circuit devices.

The testing of integrated circuits has evolved into a highly developed area of technology. Generally, such testing may be implemented through the use of external equipment, Built-In Self-Test (BIST) circuitry, or a combination of the two. Typically, all test methodologies involve shifting data into scannable memory elements of an integrated circuit device (e.g., Level Sensitive Scan Design or LSSD latches), capturing the input to the memory elements, shifting the captured data out and then comparing the captured data with predetermined values to determine whether the circuit has performed according to design. Automatic test pattern generation (ATPG) systems use tools for testing digital circuits after the circuits have been manufactured. In general, an ATPG tool generates a set of test vectors that are applied to a circuit under test. The output of the circuit is analyzed to identify logic faults in the circuit design (i.e., "functional testing"), as well as detecting fabrication defects (i.e., "structural testing").

"At-speed" testing refers to testing techniques to detect defects that are only apparent when the circuit is running at system speed. Many time-based defects cannot be detected unless the circuit is run at-speed. Examples of time related defects that occur at-speed include high impedance shorts, in-line resistance, and cross talk between signals. There are two general approaches to performing at-speed testing of combinational logic and latches in response to a test pattern that has been scanned-in, followed by a scan-out of the test results: Launch-off-Capture (LoC) and Launch-off-Scan (LoS).

LoC may be used in conjunction with any edge-based style of flip-flops or "flops," wherein the system (edge) clock is controlled at the root (e.g., source) of the clock. LoC permits a number (typically 2) of pulses to enter the clock fanout, thus the result of two clock pulses at the flops is a two-cycle execution of system operation. The two cycles may be described as the transitions between three states: present state/launch state/capture state. Although two cycles of system operation are executed, only the second cycle (i.e., the launch state to capture state transition) is actually an at-speed test. While the test clock is steady-state low prior to the first clock pulse, the master latch portion of each flop has already captured a combinational value (i.e., the launch state) because, as a flop function, the master latch loads or "captures" data while the edge clock is low, and the slave latch loads or "launches" data while the clock is high.

On the other hand, the "first pulse to second pulse" (i.e., the second cycle) is a cycle that executed at-speed since the slave latch launches into the combinational logic and the result (capture state) is loaded into the flops (into the master between the two pulses, and into the slave upon the second pulse) to complete the test. Although the final clock test state is low (meaning that an additional state has now been loaded into the master latches), the subsequent scan out of the flop will result in a shift out of the resulting capture state in the slave latch.

LoC is a simple technique; however, since it requires two cycles of system state transition, it results in less efficient test patterns than with respect to a one-cycle or simple combinational test. More specifically, it is less efficient because the capture state of each flop depends upon the value in its driving flops in the launch state, and each of these driving flops depends in turn on its own driving flops from the present state. This exponential increase in flop dependency thus reduces the number of parallel at-speed tests that can be contained in a single scanned pattern. Experimentally, this has been seen as a 6× increase over test patterns whose test operates a one-cycle execution of system operation.

In contrast, conventional LoS operates only in conjunction with certain types of edge-based flops. As is the case with LoC, two test clock pulses are issued in LoS. However, during the first clock pulse in LoS, a "Scan Enable" signal is held high such that the scanned pattern will shift for one additional cycle after the original pattern scan load. As a result, the initially scanned value in the master and slave latches is both the present and launch states. After the first pulse but before the second pulse, the Scan Enable signal is deactivated (set to 0) such that the second pulse will result in the capture of the next system state (capture state) into both the master and slave latches. Therefore, only one cycle of system state has been executed. Subsequently, the test results are shifted out, similar to LoC.

One problem with conventional LoS is that both the Scan Enable signal and the scan chain itself are subject to timing hazards, thus requiring timing closure devices (e.g., lock-up latches) across clock domain boundaries added to the design. Alternatively, the test clock may be configured to be free running, as opposed to generating two clock pulses. A clock splitter is also enhanced so as to include two gates, one for each of the master and slave clocks. As a result, the scanned-in sequence is a "skewed load" in that for the final cycle of "master (A)-slave (B)" scan clocking, only a master (A) scan clock is issued. This leaves the scanned pattern (present and launch state) in the master latches. However, the clock splitter gating keeps both the master and slave clocks low, until a synchronous transition of a control signal is received simultaneously by all clock splitters, at which time the slave clock will be ungated for a cycle (allowing launch from slave), the master clock is ungated ½ cycle later (allowing capture in master). Finally, the slave clock remains ungated ½ cycle later (allowing the master's captured data to be loaded into the slave). After this sequence, the slave latches contain the capture state, followed by a scan out of the result.

Although this modified LoS approach is an advantage over the previous LoS technique with respect to avoiding timing hazards in the scan chain (or the need to add timing closure devices in the scan chain), there is still a global timing requirement on the synchronous control signal.

Accordingly, it would be desirable to be able to address the shortcomings of conventional LoS, but in a manner that avoids both timing hazards in the scan chain, as well as the need for a global timing requirement on the synchronous control signal.

SUMMARY

The foregoing discussed drawbacks and deficiencies of the prior art are overcome or alleviated by an apparatus for selectively implementing launch-off-scan capability in at-speed testing of integrated circuit devices. In an exemplary embodiment, the apparatus includes a control device configured to selectively disable a master clock signal of a latch structure under test such that a pulse sequence of a system clock signal results in a slave-master-slave clock pulse sequence in the latch structure under test; wherein the control device utilizes the system clock signal as an input thereto and operates in a self-resetting fashion that is timing independent with respect to a scan chain.

In another embodiment, a method of selectively implementing launch-off-scan capability in at-speed testing of integrated circuit devices includes configuring a control device to selectively disable a master clock signal of a latch structure under test such that a pulse sequence of a system clock signal results in a slave-master-slave clock pulse sequence applied to the latch structure under test; wherein the control device utilizes the system clock signal as an input thereto and operates in a self-resetting fashion that is timing independent with respect to a scan chain.

BRIEF DESCRIPTION OF THE DRAWINGS

Referring to the exemplary drawings wherein like elements are numbered alike in the several Figures:

FIG. 9 is a table summarizing the various input/output values of the clock splitter circuit of FIG. 4, in various modes of operation;

FIG. 20 is a table illustrating the operation of the local control circuit of FIG. 17.

DETAILED DESCRIPTION

Disclosed herein is an apparatus and method for selectively implementing launch-off-scan capability in at-speed testing of integrated circuit devices. Briefly stated, a local clock splitter/control circuit (depending upon the specific type of latch design utilized) performs a slave-master-slave clock pulse sequence after a skewed scan load as described above. However, in so doing, the present embodiments also avoid the timing issues of the synchronous control signal. More specifically, the local clock splitter/control circuit embodiments are "self-resetting" in that the master clock is gated off after a skewed-load scan has completed. The invention embodiments described herein further utilize the two clock pulses of conventional LoC and LoS. In the self-reset state, both circuits transition to an "ungate master" state (or low-to-high on the master clock gate) only after the first slave pulse has been received. Thereby, the capture state is present in the slave latches. Although the final clock state is low (meaning that an additional state) has been loaded into the master latches, the subsequent scan out (unskewed or starting with the master scan clock) will result in a shift out of the capture state that is the result present in the slave latches, as is the case with conventional LoC and LoS.

As discussed in further detail below, two exemplary implementations of LoS control are superior to traditional implementations for at least the following reasons. First, they do not require scan chains to be subdivided and operated uniquely by clock domain, for those designs having multiple clock domains. Second, they do not require a pipeline (or any kind of timed control for that matter) from a tester or embedded test controller to the controlling device. The devices simply use the product clock to operate the clocks or gates to the latches, initiated statically by the tester or embedded test controller.

Figure 1:
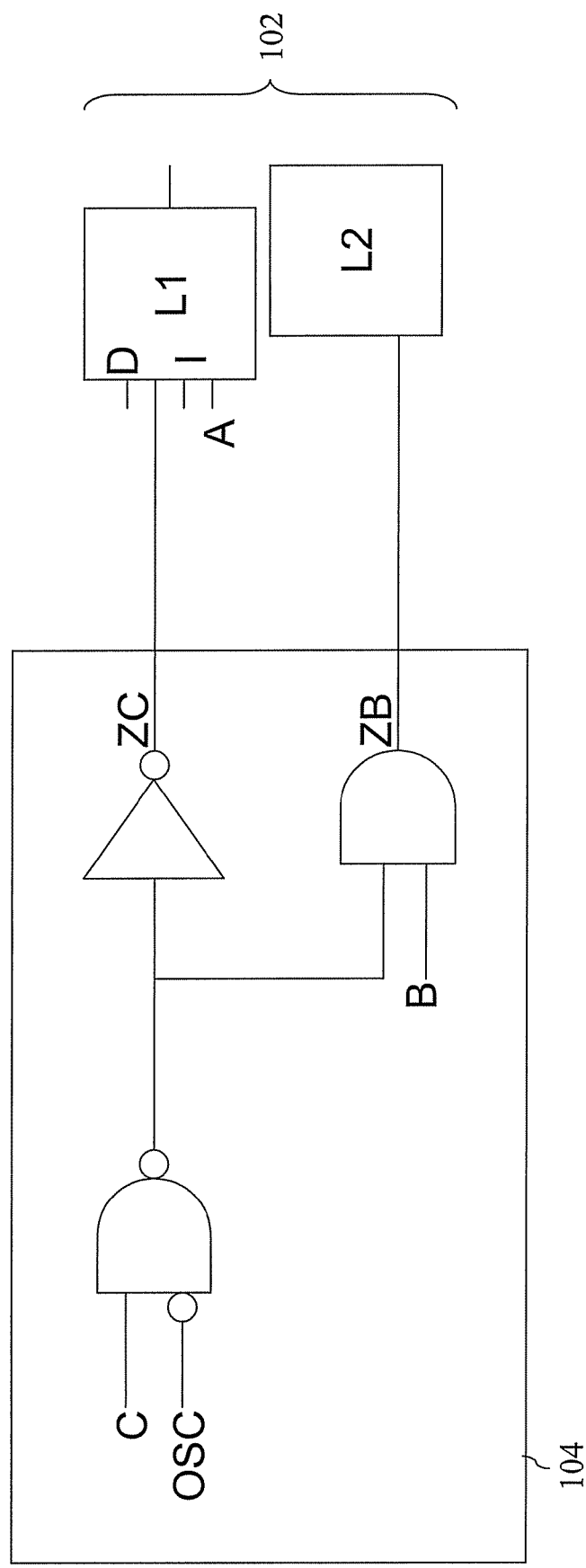
FIG. 1 is a schematic diagram of a conventional clock splitter circuit used for Launch-off-Capture (LoC) in at-speed structural testing (ASST)

Referring initially to FIG. 1, there is shown a schematic diagram of a conventional clock splitter circuit used for LoC in ASST. As shown, a latch stage 102 is configured as a pair of two-stage LSSD latches, although other configurations are possible. An individual clock splitter circuit 104 provides local "ZB" (slave) and "ZC" (master) clock signals to the LSSD latches 102 using the system clock (OSC) and external "B" and "C" test clock signals provided by an off-chip test controller device (not shown). For at-speed testing, test data is first scanned into the latches 102. Then, for LoC testing, the L1 latch in 102 receives a slow "broadside load," i.e., a slow capture of data controlled by holding the OSC (system clock) signal low while the C and B test clock signals are (sequentially) activated, as shown by the timing diagram of FIG. 2. Upon completion of the broadside load, the system clock signal OSC is pulsed twice which allows launch and capture of the L1 and L2 latches at speed.

Figure 2:
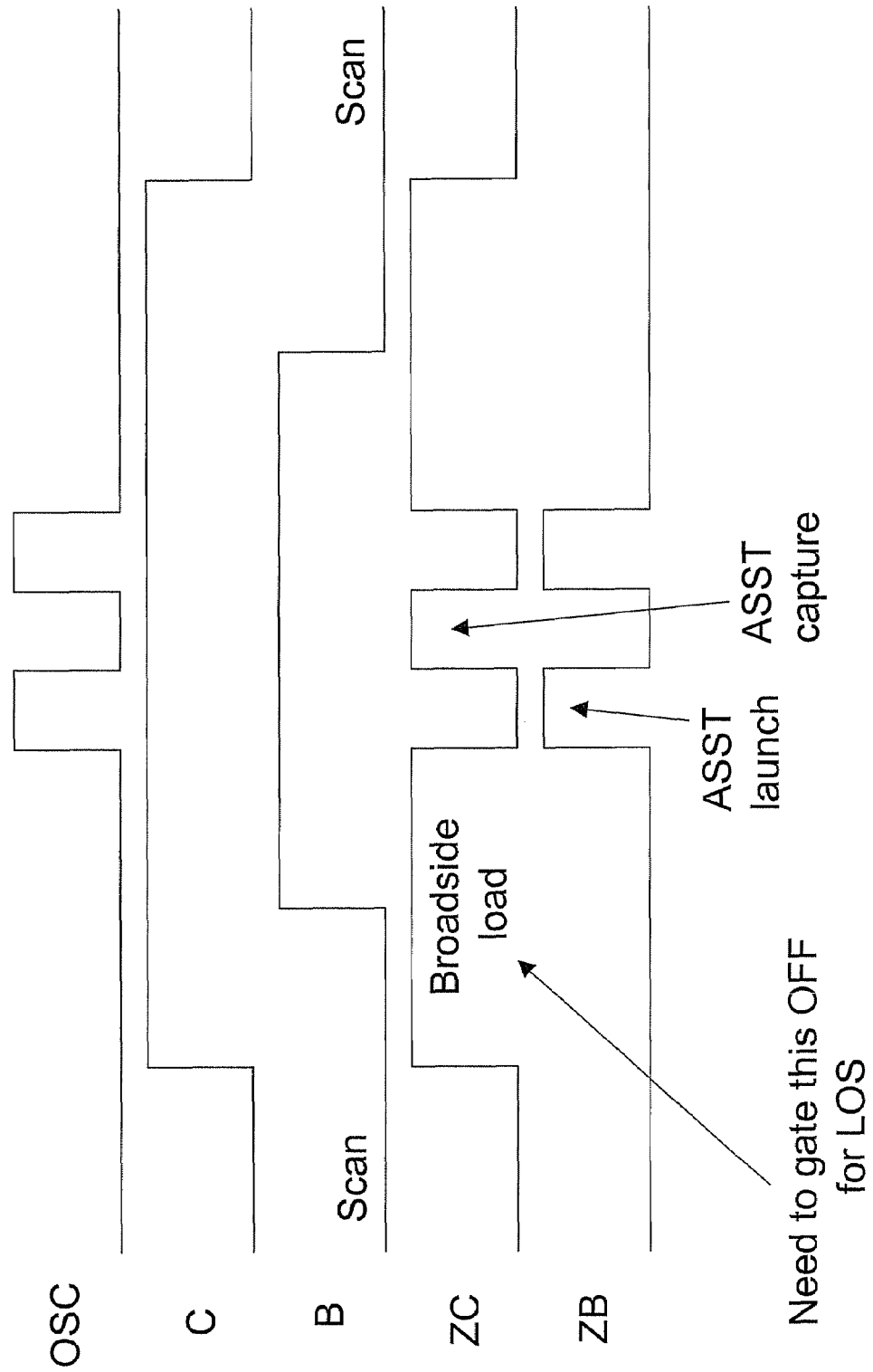
FIG. 2 is a timing diagram illustrating a conventional LoC using the clock splitter circuit of FIG. 1.
Figure 3:
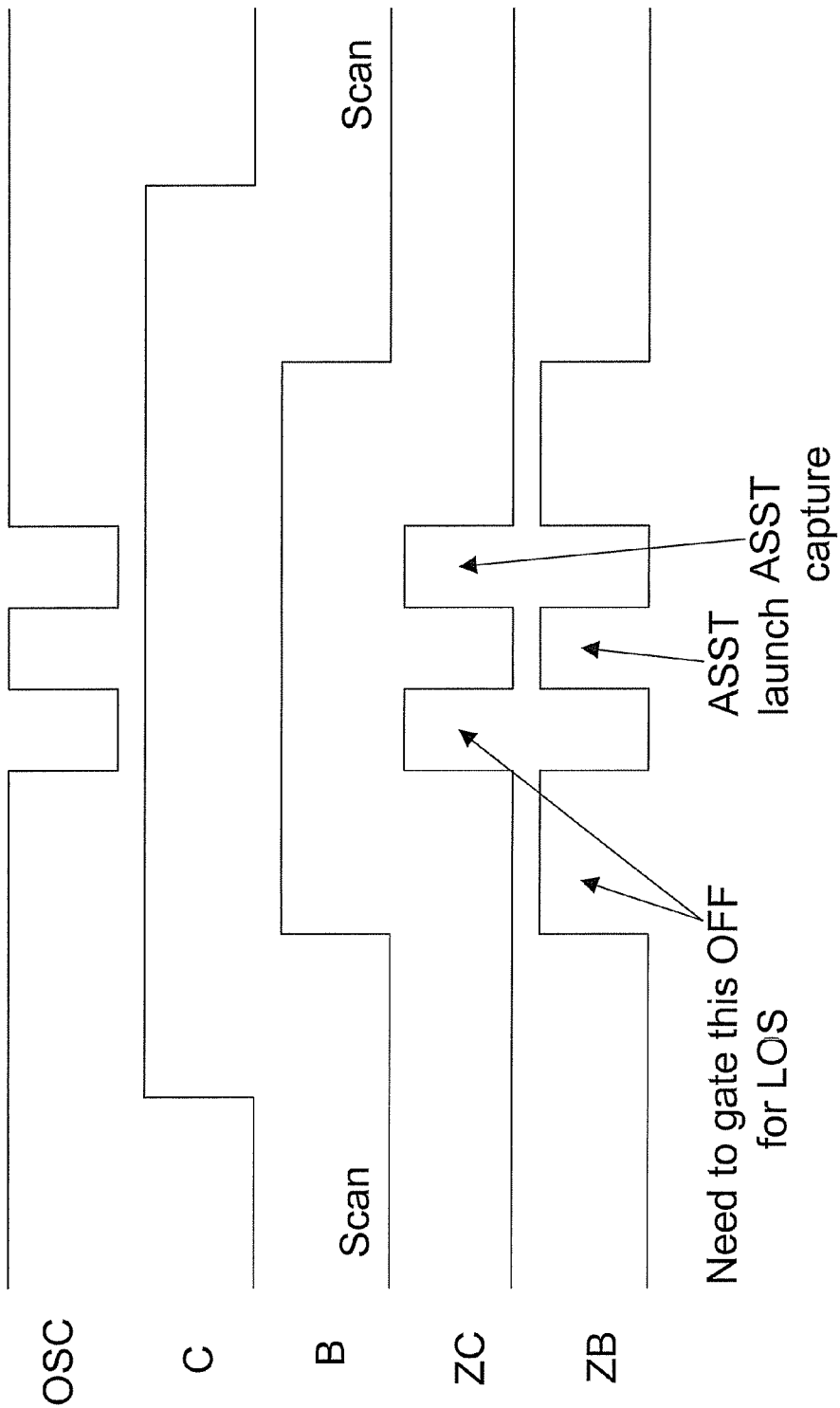
FIG. 3 is another timing diagram illustrating a conventional LoC using the clock splitter circuit of FIG. 1, wherein the latches operate with an out-of-phase clock signal.

As indicated above, however, the LoC test is a two cycle technique; in order to perform an LoS test using the local clock splitter circuit 104 of FIG. 1, the master latch clock signal ZC needs to be gated off prior to the pulsing of the system clock signal OSC as indicated in FIG. 2. FIG. 3 is another timing diagram illustrating a conventional LoC using the clock splitter circuit of FIG. 1, wherein the latches operate with an out-of-phase clock signal. As is shown therein, both the ZB and ZC clock signals need to be gated off for an out-of-phase latch for an LoS test.

Figure 4:
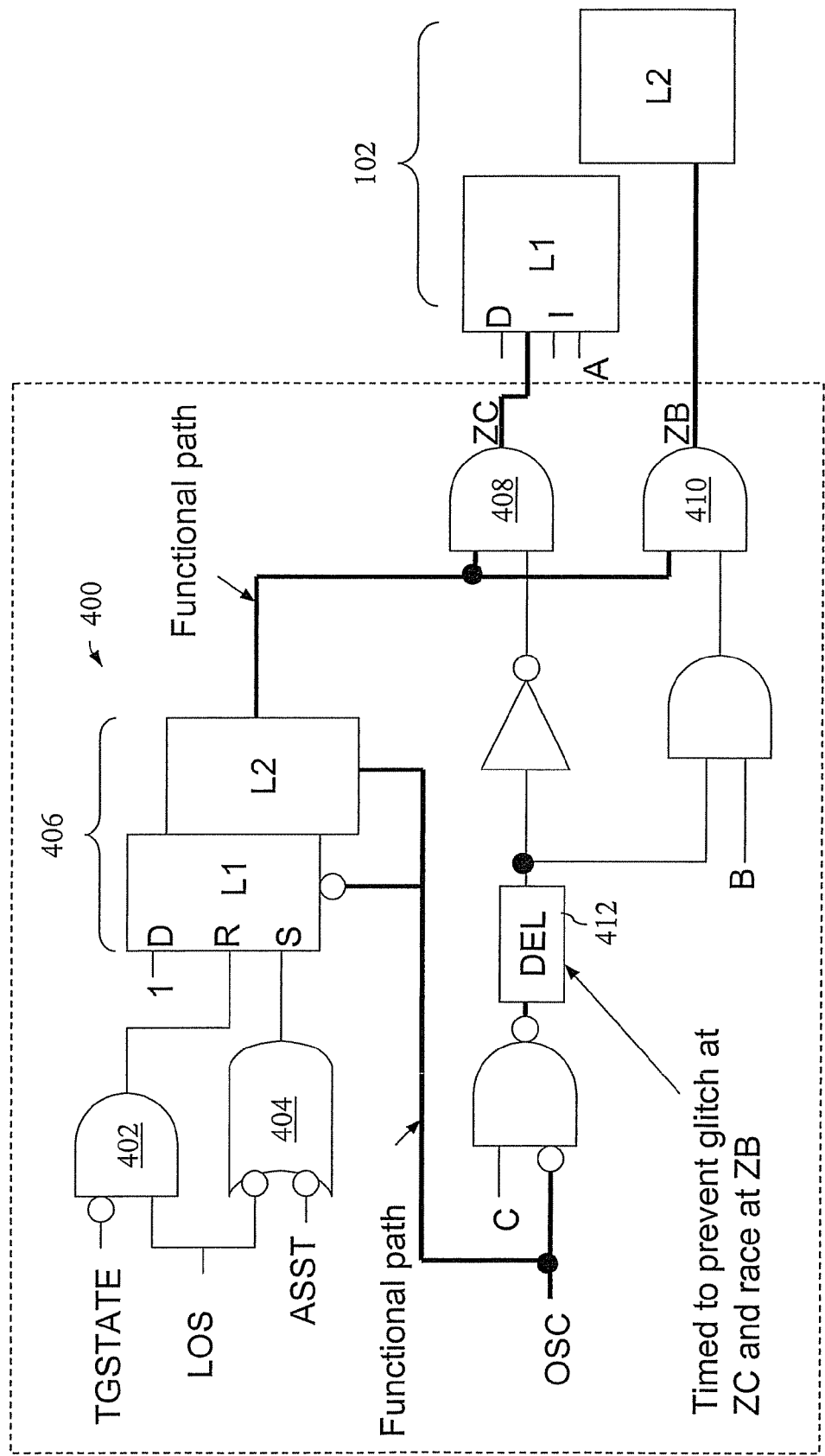
FIG. 4 is a schematic diagram of a clock splitter circuit capable of implementing Launch-off-Capture (LoC) and Launch-off-Scan (LoS) in at-speed structural testing (ASST), in accordance with an exemplary embodiment of the invention.

Therefore, in accordance with an exemplary embodiment of the invention, FIG. 4 is a schematic diagram of a clock splitter circuit 400 capable of implementing both LoC and LoS in ASST. In addition to the control signals used in the existing clock splitter circuit 104 of FIG. 1, the modified clock splitter circuit 400 utilizes additional control signals "TGSTATE," "LOS" and "ASST." From a component standpoint, the modified clock splitter circuit further includes AND gate 402, OR gate 404, edge-triggered latch 406, AND gates 408, 410, and a delay block 412.

In a system mode of operation, or a LoC mode, for example, the edge-triggered latch 406 is held in a SET state (i.e., one or both of the LOS and ASST control signals are "0"). In turn, the logic "1" value on the data input of L1 of the latch 406 is maintained at the output of L2, given that L1 of latch 406 is clocked by the inverse of the OSC system clock and L2 of latch 406 is clocked by the OSC system clock. In this case, it will be noted that the first (top) inputs of AND gates 408 and 410 are set to "1," thereby passing the value of the second (bottom) inputs of AND gates 408 and 410 to ZC and ZB, respectively. In other words, when L1 of edge-triggered latch 406 is held to a SET state, the clock splitter circuit 400 effectively reduces to the clock splitter circuit 104 of FIG. 1, with the addition of the delay block 412.

Figure 5:
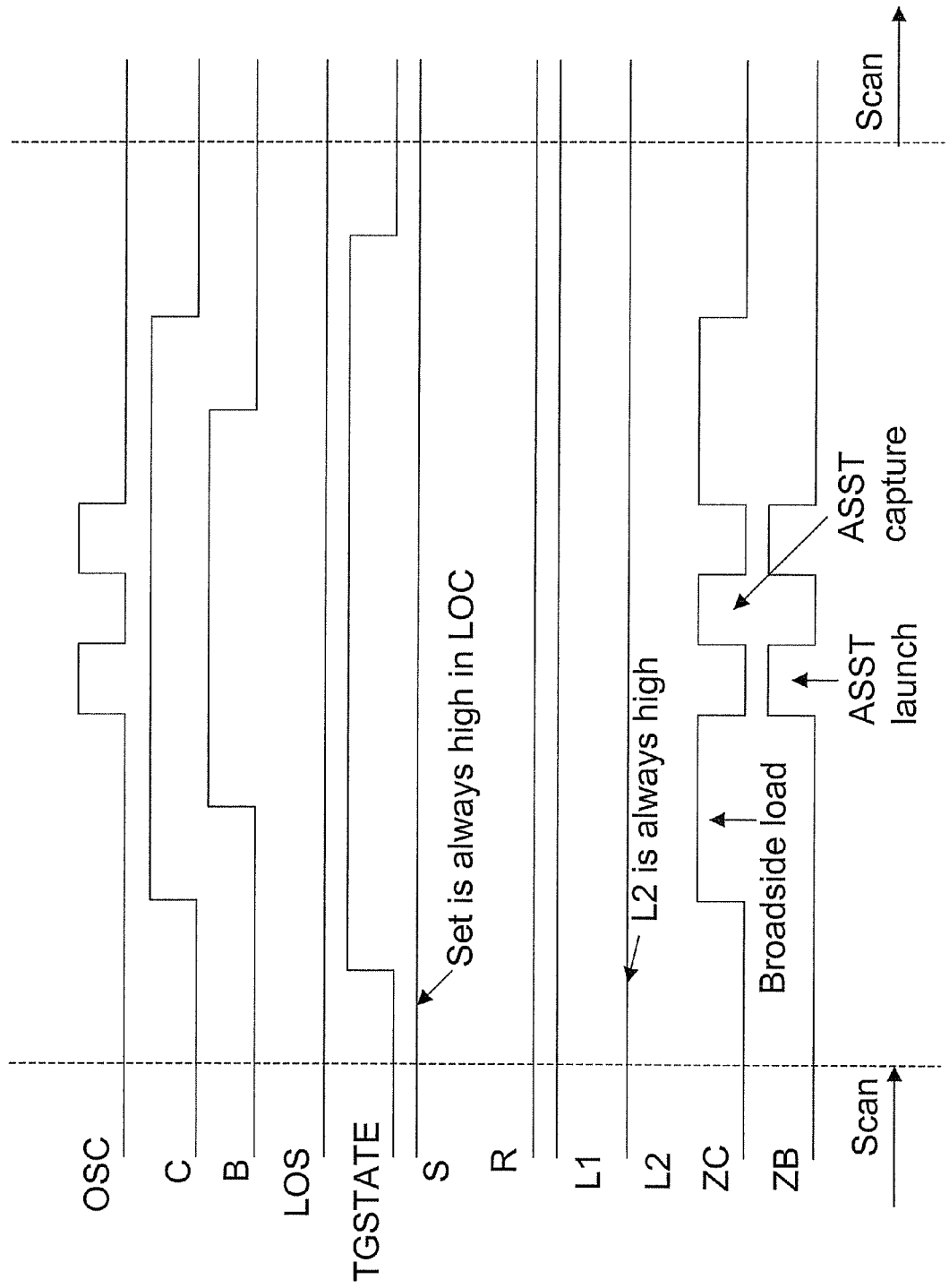
FIG. 5 is a timing diagram illustrating an LoC operation using the clock splitter circuit of FIG. 4.
Figure 6:
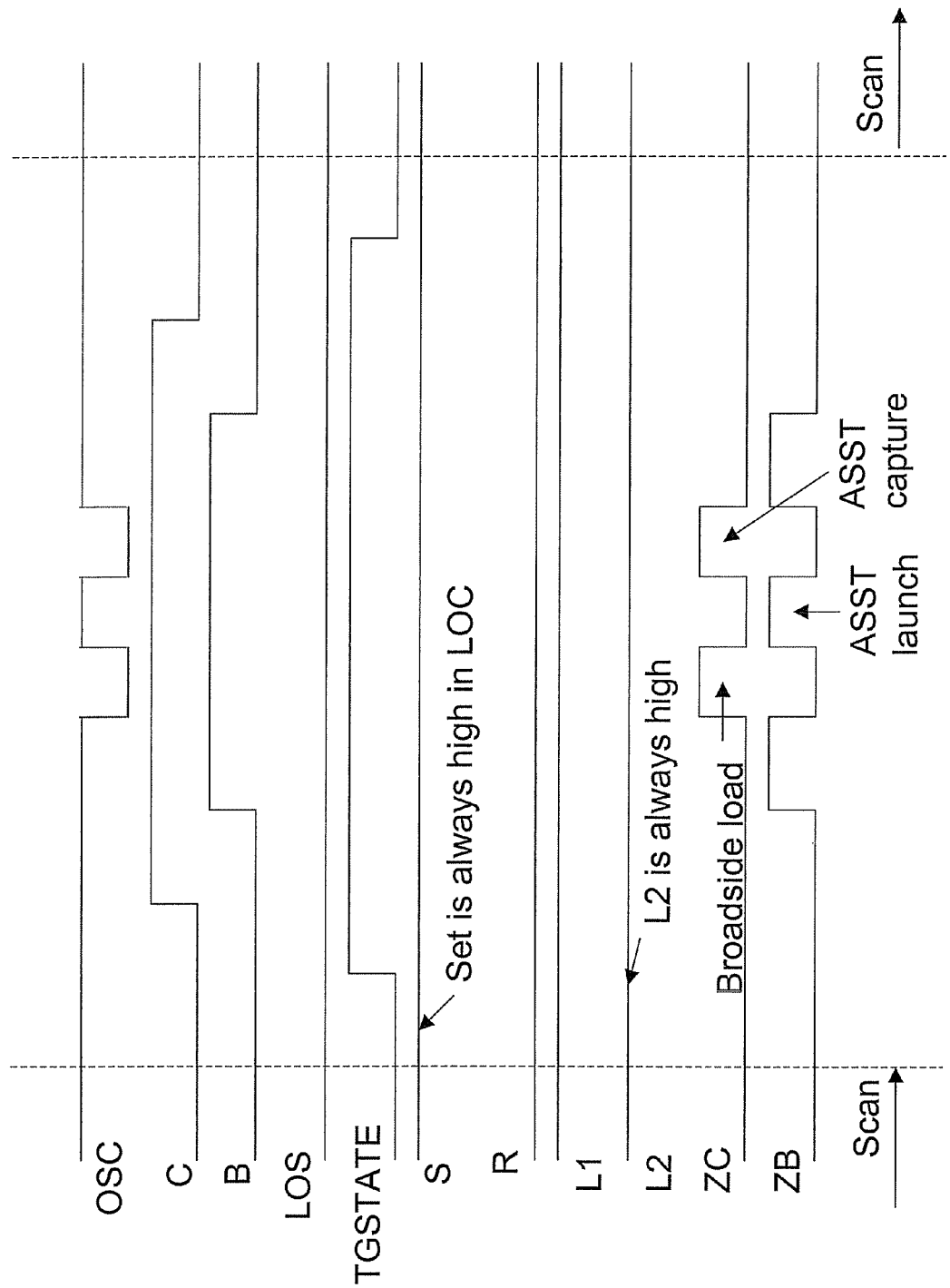
FIG. 6 is another timing diagram illustrating an LoC operation using the clock splitter circuit of FIG. 4, wherein the latches operate with an out-of-phase clock signal.

By way of further illustration, FIG. 5 is a timing diagram illustrating an LoC operation using the clock splitter circuit of FIG. 4. As can be seen, even after the scan portion of the operation, because control signal LOS is maintained at 0, the output of OR gate 404 stays at 1, thus maintaining L1 of the edge-triggered latch 406 in the SET state. In turn, the output of L2 of the edge-triggered latch 406 stays high, allowing the broadside load pulses on ZC and ZB to be passed through to the LSSD latch pair 102. The corresponding LoC for an out-of-phase latch pair is shown in the timing diagram of FIG. 6.

Figure 7:
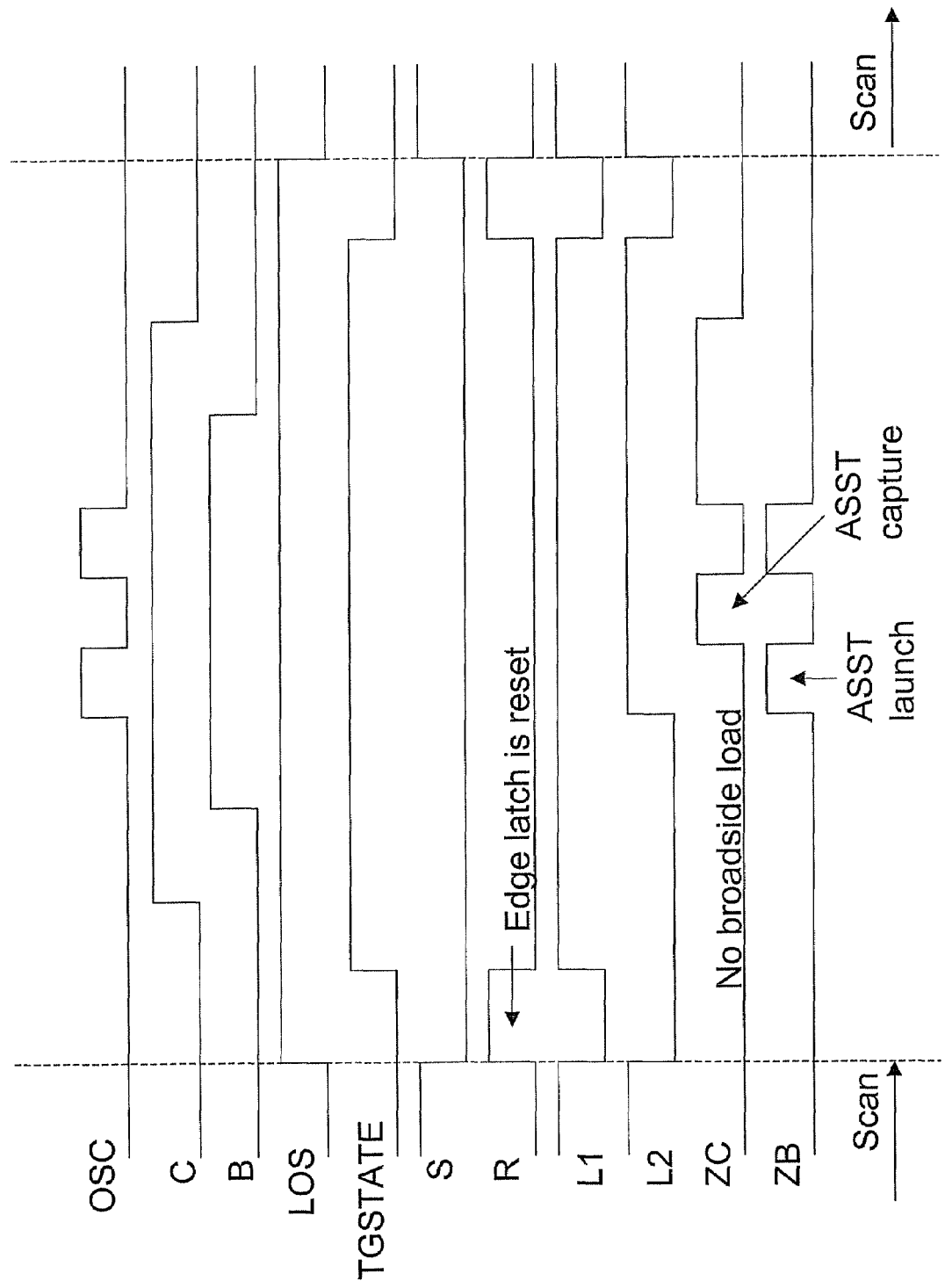
FIG. 7 is a timing diagram illustrating an LoS operation using the clock splitter circuit of FIG. 4.

In contrast, during an LoS operation according to the present invention embodiment, the edge-triggered latch 406 is RESET prior to the OSC pulses. This effectively gates off the broadside load and any pulses to ZC and ZB. Then, upon a subsequent rising edge of the system clock OSC, latch L2 of the edge-triggered latch is set to 1, thereby allowing ZC and ZB pulses through the clock splitting circuitry. An LoS operation using the circuitry of FIG. 4 is illustrated by the timing diagram of FIG. 7. During the scan portion of the test, control signal LOS is at 0, thus the edge-triggered latch 406 is SET at this point. Once the scan-in is complete, the LOS signal transitions to 1, which causes the output of OR gate 404 to fall to 0 and the output of AND gate 402 to rise to 1 (It is noted that control signal ASST is maintained at 1 during at-speed testing, and thus not specifically shown in the various at-speed timing diagrams). That is, the edge-triggered latch 406 is RESET so as to gate off ZC and ZB pulses.

Then, by switching control signal TGSTATE from 0 to 1 (the inverted value of which is an input to AND gate 402), the RESET of edge-triggered latch 406 is deactivated, although the SET function is not specifically activated at that point. This captures a "1" value in L1 of the edge-triggered latch 406, but this is not loaded into L2 at this point, because OSC is still held low. Once the first rising pulse of OSC occurs, the output of L2 of the edge-triggered latch 406 goes back to 1, thus allowing the slave-master-slave clock pulses (ZB-ZC-ZB) for an LoS. Finally, TGSTATE and LOS are set back to 0, thus placing the edge-triggered latch 406 in a SET state for a subsequent scan operation.

Figure 8:
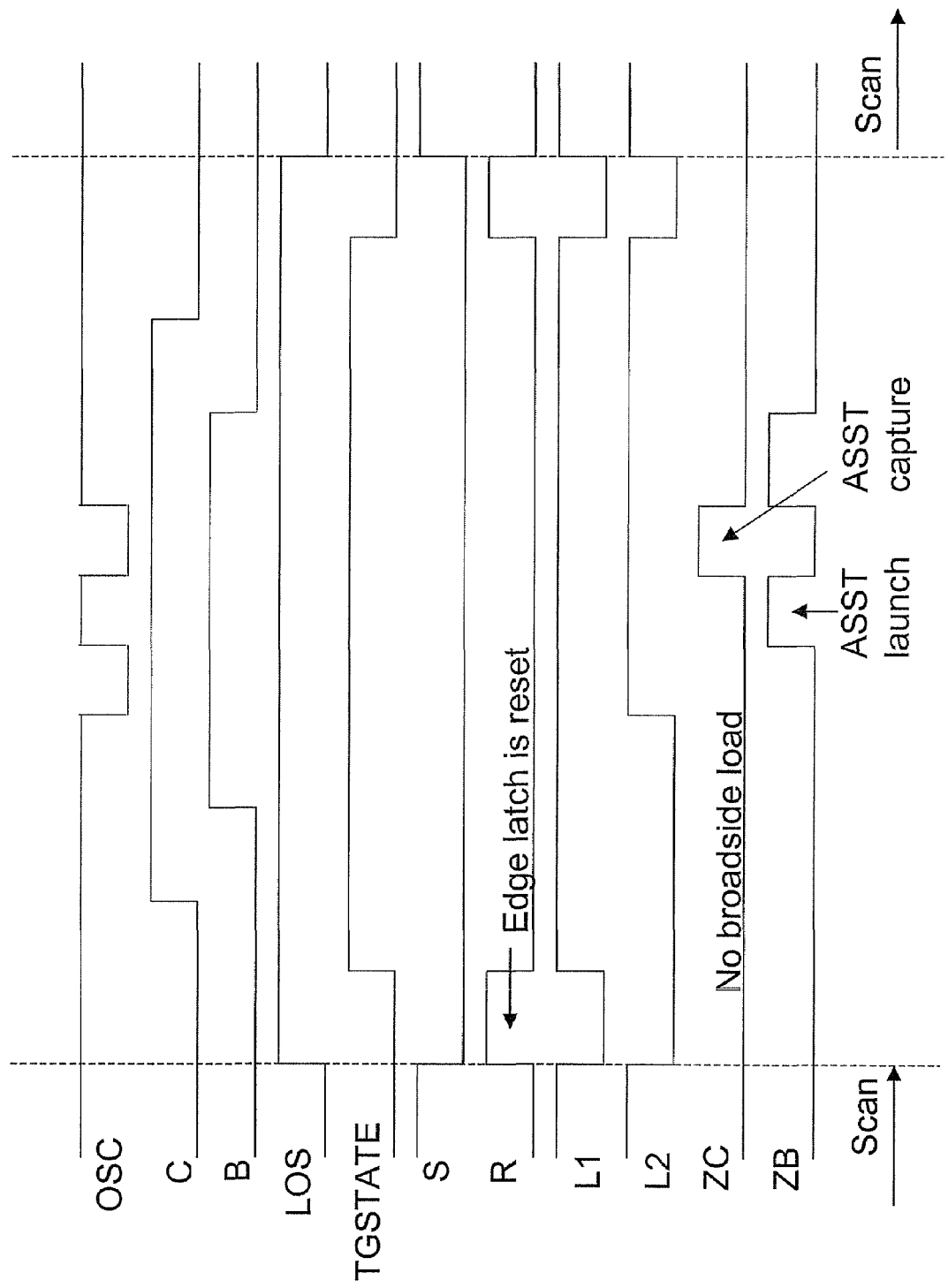
FIG. 8 is another timing diagram illustrating an LoS operation using the clock splitter circuit of FIG. 4, wherein the latches operate with an out-of-phase clock signal.

FIG. 8 is another timing diagram illustrating an LoS operation using the clock splitter circuit of FIG. 4, wherein the latches operate with an out-of-phase clock signal. As can be seen, the broadside load is still gated off prior to the first rising edge of OSC, after which a slave-master-slave clock pulse sequence is generated by the clock splitter circuitry. FIG. 9 is a table summarizing the various input/output values of the clock splitter circuit of FIG. 4, in various modes of operation. As is shown, all of the control inputs of the clock splitter circuit 400 (i.e., ASST, LOS and TGSTATE) are statically controlled, with the timed path comprising the path from the system clock OSC to the ZC and ZB clock outputs.

Figure 10:
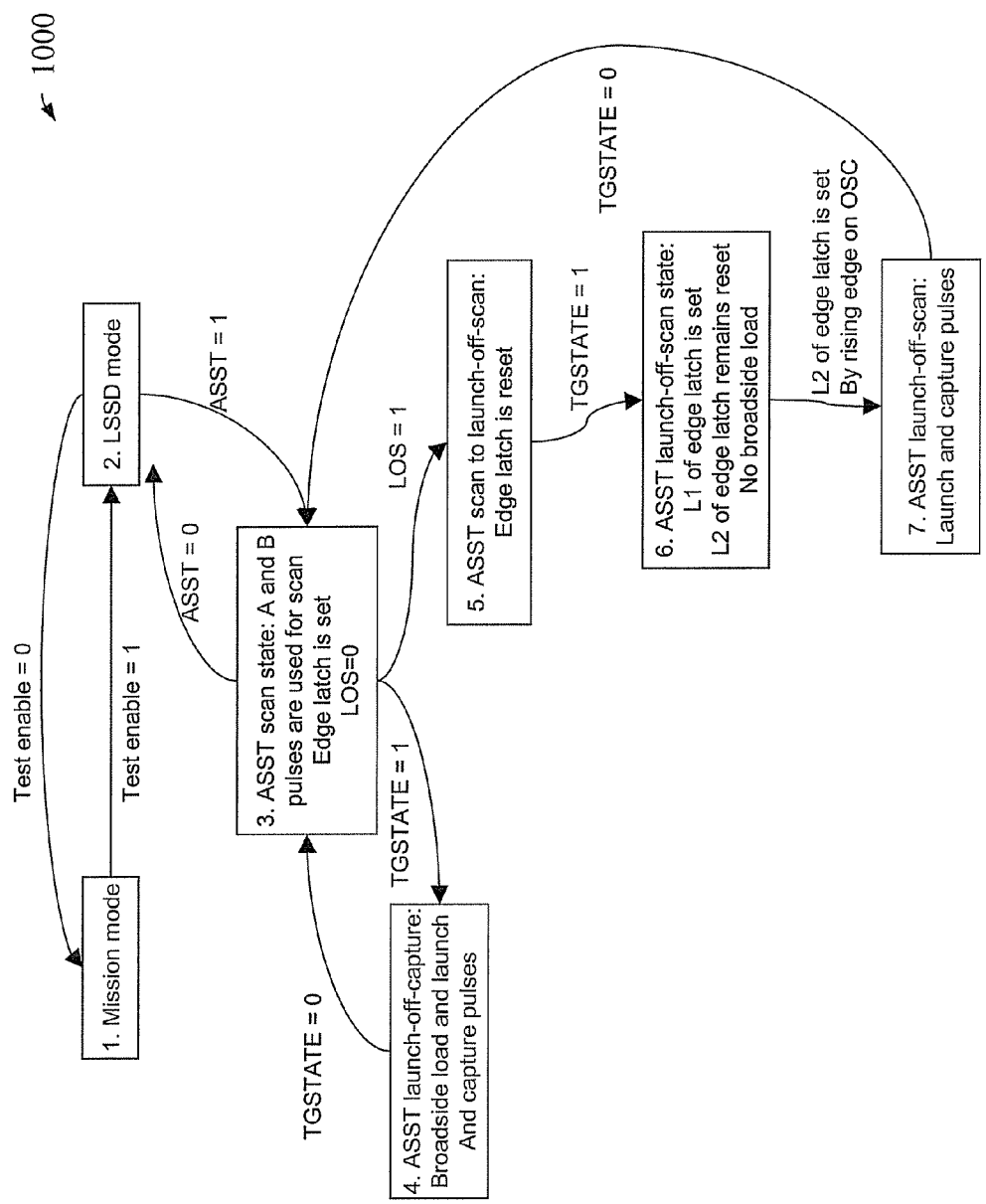
FIG. 10 is a state diagram summarizing the transition between various modes of operation enabled by the clock splitter circuit of FIG. 4.

Referring now to FIG. 10, there is shown a state diagram 1000 summarizing the transition between various modes of operation enabled by the clock splitter circuit of FIG. 4. The top portion of the diagram 1000 simply represents the transition between a "mission" or system mode of operation (state 1) and an LSSD or test mode of operation (state 2). Once in LSSD mode, control signal ASST is set from 0 to 1 to switch into an ASST scan state (state 3), wherein A and B pulses are used for scanning. Again, because ASST=1, the edge-triggered latch 406 is SET. From this state, either an ASST LoC operation can be launched (state 4), with TGSTATE=1, or an ASST LoS operation (beginning in state 5), with LOS=1. In LoS, after the edge-triggered latch 406 is RESET, the RESET is disabled by setting TGSTATE=1 (state 6), and setting L1 of the edge-triggered latch 406 without setting L2 at this point. Again, this state gates off the broadside load function. Finally, the L2 of edge-triggered latch 406 is SET by the rising edge on OSC (state 7). This enables the slave-master-slave pulses for LoS, after which TGSTATE is set to 0 (returning to state 3).

Figure 11:
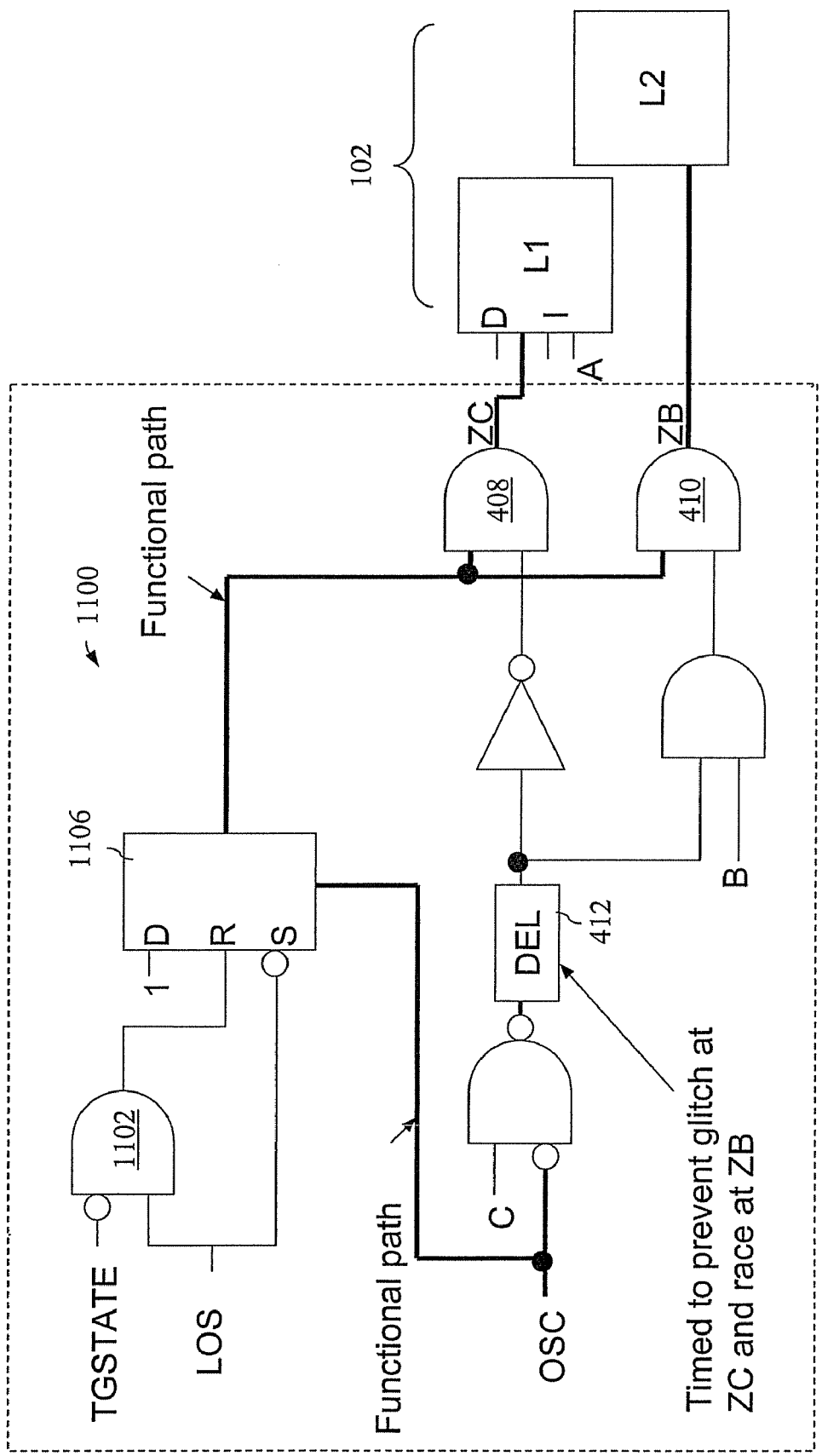
FIG. 11 is a schematic diagram of a simplified version of the clock splitter circuit of FIG. 4.

Referring once again to FIG. 4, the clock splitter circuit 400 could alternatively be simplified by replacing the positive edge-triggered latch 406 with a positive clocked, simple latch. Such a modification is depicted in the alternative clock splitter circuit 1100 of FIG. 11. As compared to FIG. 4, the clock splitter circuit 1100 in FIG. 11 utilizes a positive clocked, simple latch 1106. Control signals TGSTATE and LOS are still utilized, but control signal ASST is eliminated in this embodiment. It will be noted that in this embodiment, latches operating with an out-of-phase clock would not be supported.

Figures 12, 13:
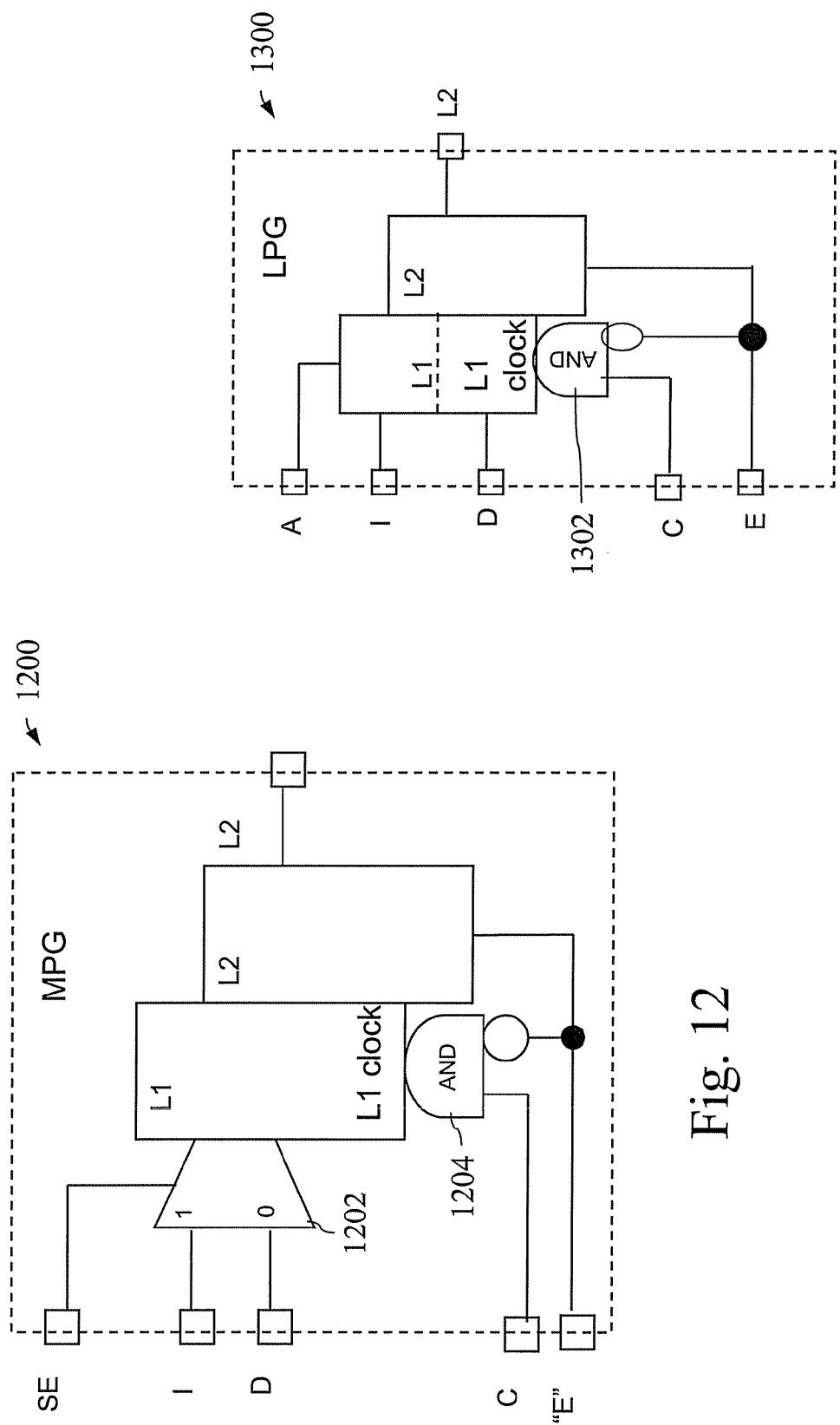
FIG. 12 is a schematic diagram of a latch structure with built-in L1 clock suppressing capability, suitable for use in accordance with a further embodiment of the invention.
FIG. 13 is a schematic diagram of another latch structure with built-in L1 clock suppressing capability, suitable for use in accordance with a further embodiment of the invention.

In addition to the LSSD latch design 102 as illustrated in FIG. 4, which utilizes the novel clock splitting circuitry 400, the disclosed LoS approach is also applicable to other types of latch designs. For example, FIG. 12 is a schematic diagram of a latch structure 1200 with built-in L1 clock suppressing capability, suitable for use in accordance with a further embodiment of the invention. In particular, the latch structure 1200 is one-port L1 latch driven by a multiplexer (mux), referred to as a muxed pulsed gate (MPG), used for edge trigger system operation. In a first mode of operation, the MPG 1200 provides an edge clock function (e.g., L1 inverted and L2 in-phase) internal to the latch-pair when C=1. The MPG 1200 of FIG. 12 includes a mux 1202, a first latch, L1 and a second latch, L2. The data input is muxed between system and scan operation under control of SE. In this implementation, the mux 1202 can select between the I pin, which is the scan input, and the D pin, which is the data input, both operating under the control of a single clock which is the output of the AND gate 1204. As will be noted, the C pin may be used to block the clock to the L1 latch when C=0, due to the function of the AND gate 1204 (i.e., MPG 1200 provides built-in L1 clock suppressing capability).

FIG. 13 is a schematic diagram of another latch structure 1300 with built-in L1 clock suppressing capability, also suitable for use in accordance with a further embodiment of the invention. In particular, the latch structure 1300 is a two-port latch with no mux, referred to as a latched pulsed gate (LPG), used for edge trigger system operation. The LPG 1300 provides the edge clock function (L1 inverted and L2 in-phase) internal to the latch-pair when C=1. The LPG 1300 can capture data input when the C-pin (C clock) is active, and scan data when the A-pin (A clock) is active. Like the MPG 1200, the LPG 1300 provides built-in L1 clock suppressing capability through setting pin C=0. Thereby, the clock signal to L1 is blocked due to AND gate 1302.

Additional information regarding MPG and LPG latch structures may be found in U.S. Patent Application Publication 2006/0208783 by Lackey, et al., assigned to the assignee of the present application, the contents of which are incorporated by reference herein in their entirety.

Figure 14:
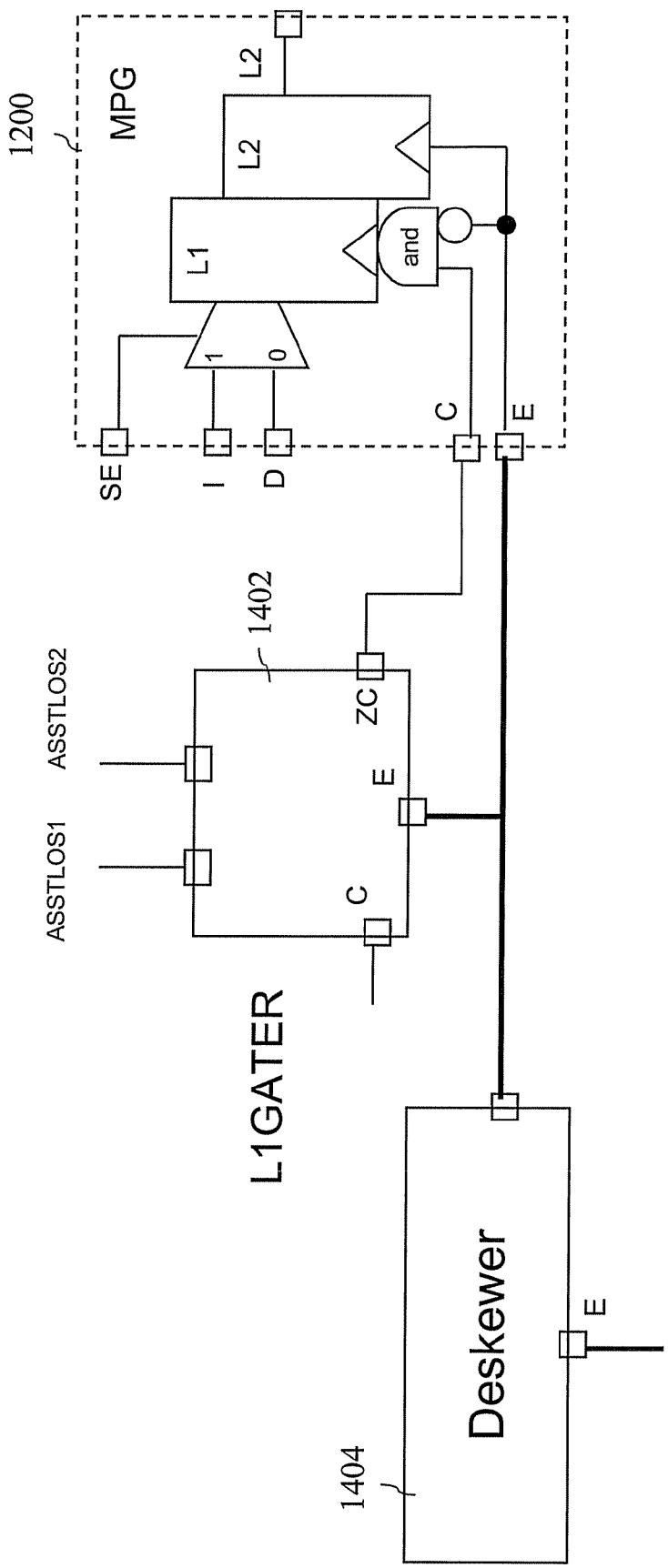
FIG. 14 is a schematic diagram of a local control circuit capable of implementing LoC and LoS in ASST for the latch structures of FIGS. 12 and 13, in accordance with a further embodiment of the invention.

Referring now to FIG. 14, there is shown a schematic diagram of a local control circuit 1402 capable of implementing LoC and LoS in ASST for the latch structures of FIGS. 12 and 13, in accordance with a further embodiment of the invention. For purposes of illustration, the MPG 1200 of FIG. 12 is illustrated in the exemplary embodiment of FIG. 14; however, it will be understood that the local control circuit 1402 could also be used in conjunction with the LPG 1300 of FIG. 13. As is shown, the local control circuit 1402 (also labeled as "L1GATER") includes a pair of ASST LoS control inputs, ASSTLOS1, ASSTLOS2, the C clock signal, and the system clock signal (pin E) as outputted by a clock controller or "deskewer" 1404. The output of the local control circuit 1402, ZC, is coupled to the C input of the MPG 1200, and determines whether the L1 clock signal to MPG 1200 is gated off.

Figure 15:
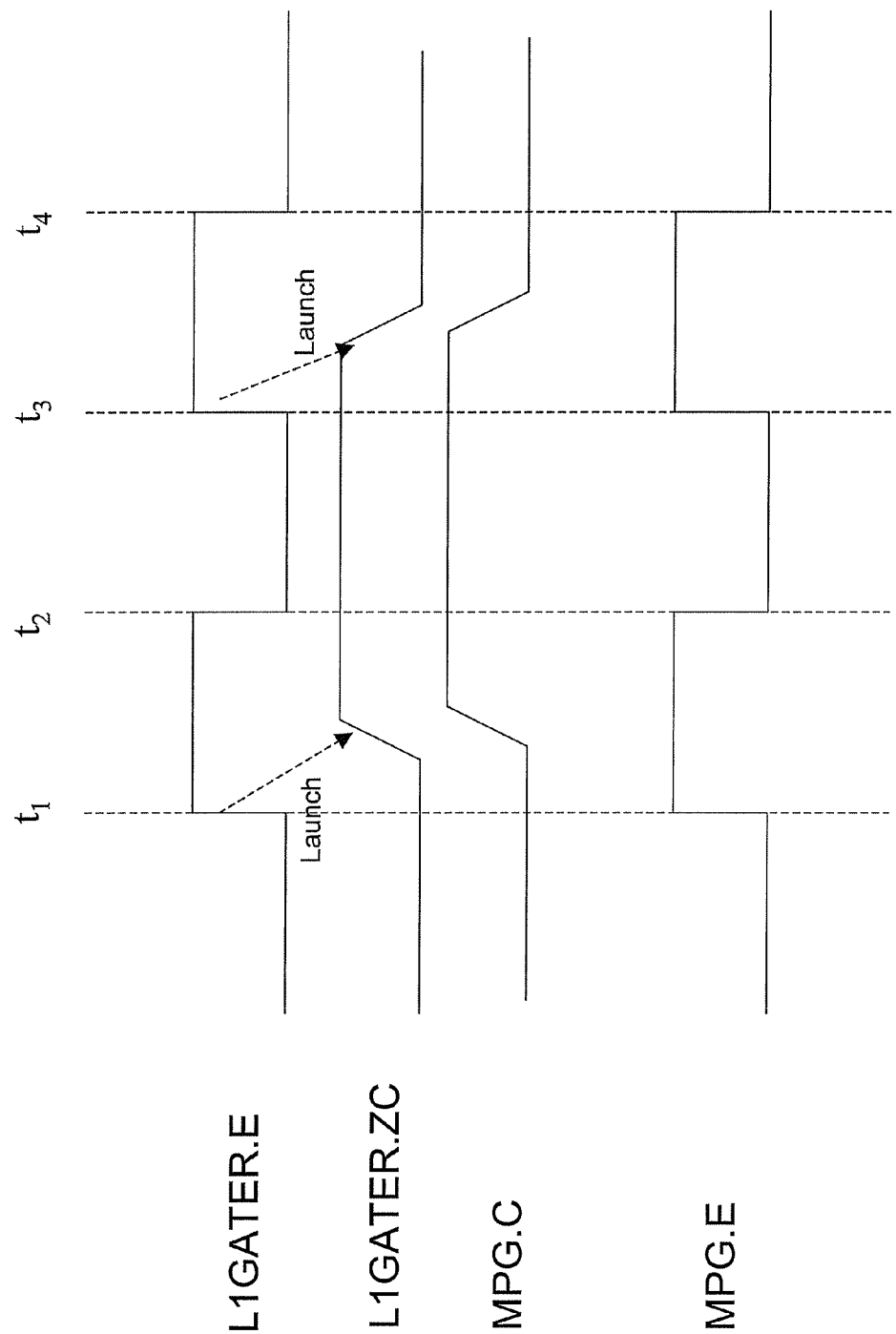
FIG. 15 is a timing diagram illustrating an LoS operation using the local control circuit of FIG. 14.

FIG. 15 is a timing diagram illustrating an LoS operation using the local control circuit 1402 of FIG. 14. During the time that the output of L1GATER (ZC)/input of MPG (C) is low (prior to time $t_1$), pulsing of the L1 clock is gated off due to the AND gate of the MPG structure. Upon receiving the rising edge of the system clock pulse (i.e., pins E of L1GATER and MPG) transitioning from low to high at time $t_1$, the slave latch L2 of MPG is pulsed. Then, as also shown in the waveform diagram of FIG. 15, the first rising edge of the system clock signal (pin E) at time $t_1$ causes the output of L1GATER (ZC)/input of MPG (C) to switch from low to high. However, due to the inverted value of the system clock signal applied to the AND gate of MPG, L1 of MPG is not pulsed as a result of this first rising edge. Once the system clock returns to low at time $t_2$, the inverted (high) signal is sent to the AND gate coupled to L1 of MPG. Because the C pin is now also high, L1 of MPG is pulsed.

Then, at time $t_3$, the system clock is pulsed for a second time. In addition to pulsing L2 of MPG for the second time, the internal logic within L1GATER switches the output of L1GATER (ZC)/input of MPG (C) to switch back from high to low, thus gating off L1 of MPG. Finally, at time $t_4$, the system clock returns to low, wherein neither L1 nor L2 is pulsed, due to the fact that L1 is gated off by the MPG (C) pin being gated off. As will be seen, therefore, the MPG (or LPG) latch may be made to implement a slave-master-slave clock sequence wherein the master latch (L1) clock only occurs (at-speed) between the two system clock pulses. When using a skewed scan load (which leaves the test pattern in the master latches, the overall result is a one-cycle, at-speed sequence.

The at-speed test objective is achieved as for an LoC, only with a one-cycle test that increases the test coverage of a given pattern count.

Figure 16:
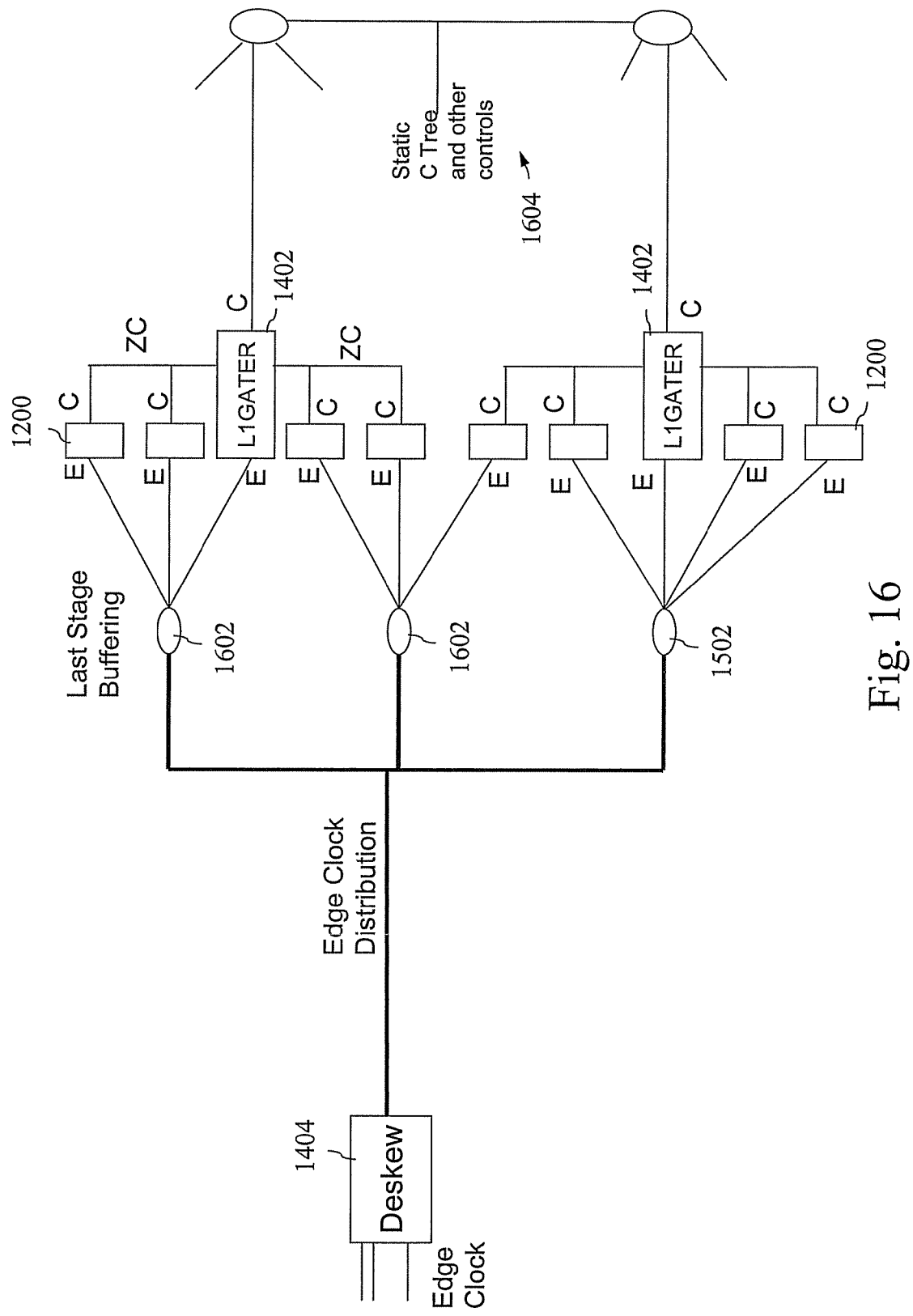
FIG. 16 is a high-level schematic diagram illustrating a system clock distribution for a plurality of local control circuits and latch structures shown in FIG. 14.

FIG. 16 is a high-level schematic diagram illustrating a system clock distribution for a plurality of local control circuits and latch structures shown in FIG. 14. As is shown, a plurality of latch devices (e.g., MPG latch structures 1200) may be serviced by a local control circuit 1402. The deskewer 1404 distributes the system edge clock signal, through one or more last stage buffering devices 1602 to the "E" input pins of both the MPG latch structures 1200 and local L1GATER control circuits 1402 associated therewith. A static "C" clock tree 1604 distributes the C clock (master latch enable) input signals and other control signals to each of the local L1GATER control circuits 1402.

Figure 17:
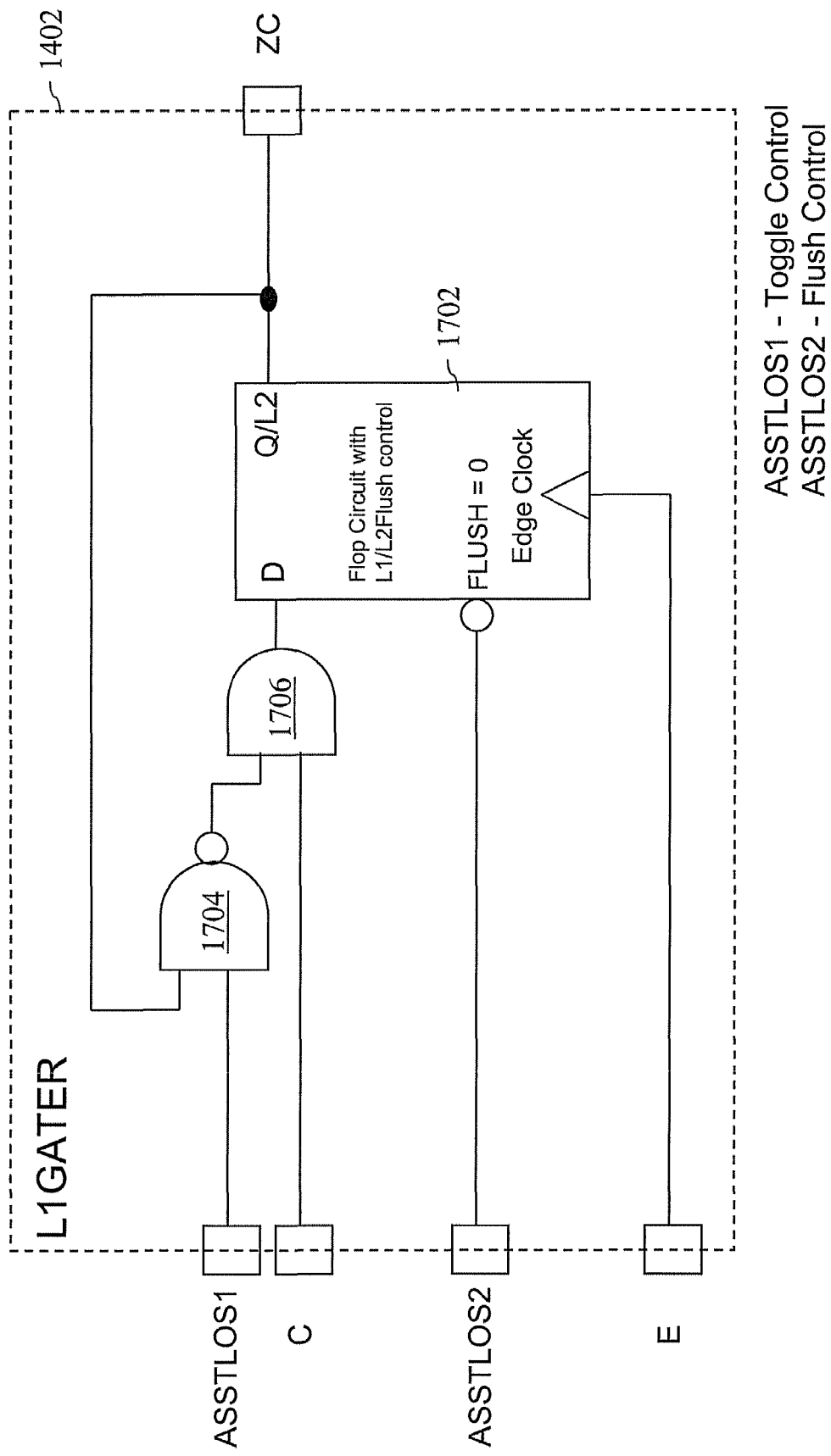
FIG. 17 is a more detailed schematic diagram illustrating the internal logic of the local control circuit of FIG. 14.

Referring now to FIG. 17, there is shown a more detailed schematic diagram illustrating the internal logic of the local control circuit 1402 (L1GATER) of FIG. 14. As is shown, L1GATER includes a flop circuit 1702 having L1/L2 flush control, the output (ZC) of which is also internally fed back to an input of a NAND gate 1704, the other input of which is external control signal ASSTLOS1. The output of NAND gate 1704 is fed to an AND gate 1706, the other input of which is the master clock enable input signal C. The output of the AND gate 1706 is the data input of the flop circuit 1702. External control signal ASSTLOS2 is the flush control signal for the flop circuit 1702, wherein a 0 value coupled to pin ASSTLOS2 flushes that data on flop pin D to the output pin Q/L2 of the flop circuit 1702 (and thus the output pin ZC of L1GATER). When a 1 value is coupled to pin ASSTLOS2, the flop circuit 1702 acts as a positive edge flip-flop.

Figure 18A:
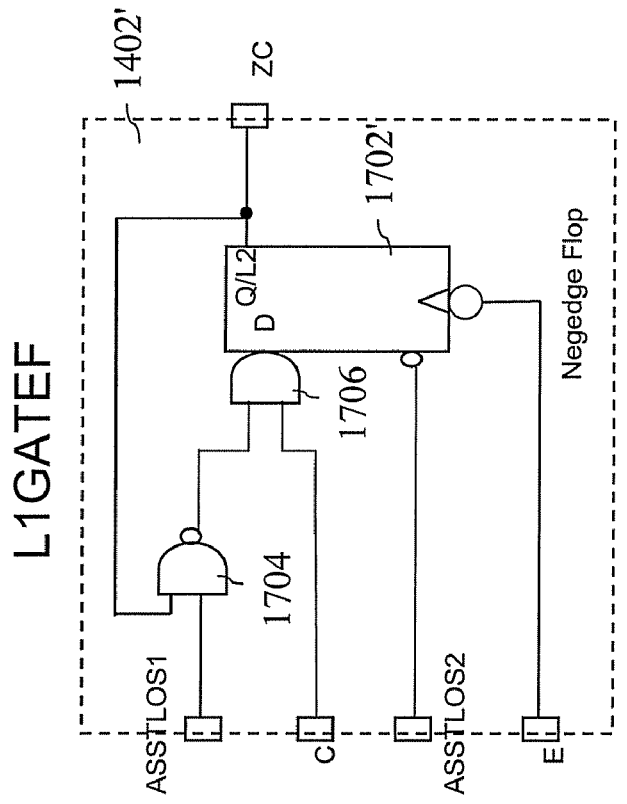
FIGS. 18(a) and 18(b) are schematic diagrams illustrating a side-by-side comparison of the internal logic of the local control circuit of FIG. 17, and a corresponding local control circuit used for driving out-of-phase latch structures.
Figure 18B:
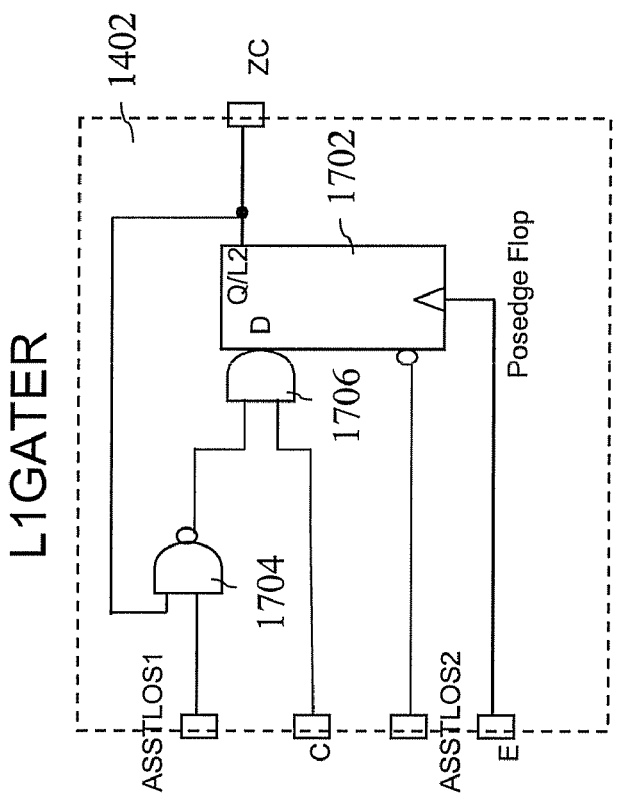

By way of comparison, FIGS. 18(a) and 18(b) are schematic diagrams contrasting the internal logic of the local control circuit of FIG. 17, and a corresponding local control circuit 1402' (L1GATEF) used for driving out-of-phase latch structures. Whereas control circuit 1402 of FIG. 18(a) illustrates the latches of the flop circuit 1702 driven by a positive edge on a positive clock and a negative edge on a negative clock, the control circuit 1402' of FIG. 18(a) illustrates the latches of the flop circuit 1702' driven by a negative edge on a positive clock and a positive edge on a negative clock.

Figure 19A:
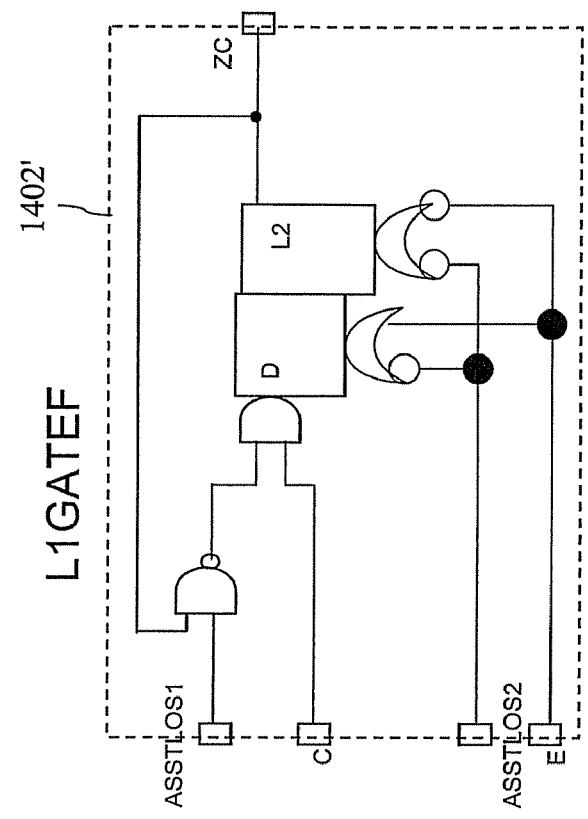
FIGS. 19(a) and 19(b) are schematic diagrams illustrating the flush function of the local control circuits of FIGS. 18(a) and 18(b)
Figure 19B:
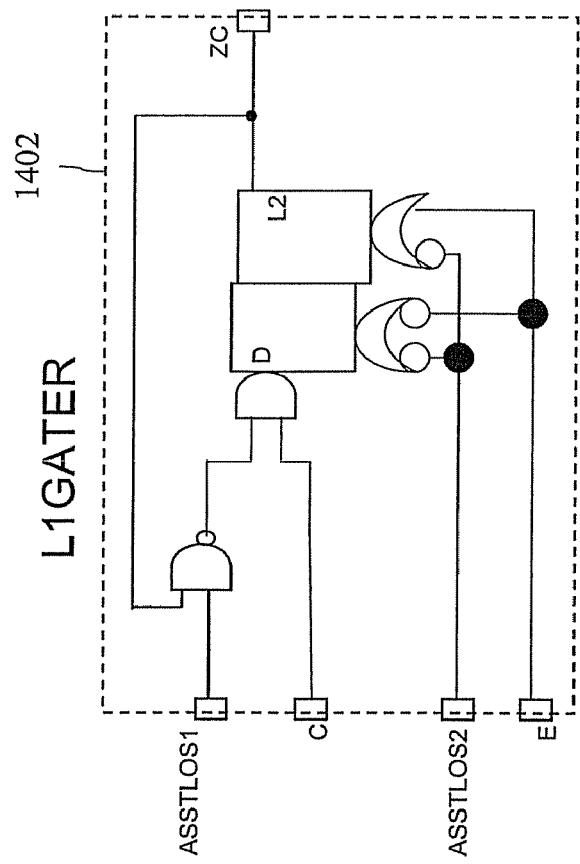

FIGS. 19(a) and 19(b) are schematic diagrams illustrating the flush function of the local control circuits of FIGS. 18(a) and 18(b) in further detail by depicting the individual L1/L2 structures of the flop circuits 1702/1702'. As is shown for both cases, when ASSTLOS2 is 0, the latches flush since the inverted value is coupled to OR gates associated with both of the L1 and L2 latches. When ASSTLOS2 is 1, the latches of L1GATER 1402 act as a positive edge triggered flop, and the latches of L1GATEF 1402' act as a negative edge triggered flop.

FIG. 20 is a table illustrating the operation of the local control circuit 1402 of FIG. 17. In a system mode of operation, the master clock enable input signal C is maintained at 1, with both control signals ASSTLOS1 and ASSTLOS2 held at 0. Thus, the internal flop circuit 1702 of L1GATER is placed in a flush mode such that the data input to the flop circuit 1702 (which is 1) is flushed to the output pin ZC. This, L1GATER will permit the chip latch devices (e.g., MPG type, LPG type) to operate as normal (i.e., the master latch clock is not gated off). The particular state of the system clock input E is irrelevant to L1GATER in the system mode. During scanning/LSSD testing, both ASSTLOS1 and ASSTLOS2 are still held at 0, with the flop circuit 1702 still in a flush mode. In this case, the output of L1GATER depends on the master clock enable input signal C; i.e., it flushes the signal on the input pin C to the output pin ZC.

During a scan to launch/capture transition sequence, the system clock input is initially held low (prior to the pulse-pulse of the system clock). In addition, the master clock enable input signal C is low in this mode, thus the data input to the flop circuit 1702 is 0. This 0 value is initially flushed to the ZC output of L1GATER, thereby gating off the master clock signal of the latch under test, as previously indicated above. Then (still in the scan sequence), ASSTLOS2 switches from 0 to 1, which deactivates the flush mode. However, since the system clock input E is held low during the scan, there is no positive edge to trigger a potential state change in the flop circuit 1702. The next signal change in the scan mode is a change in the value of ASSTLOS1 from 0 to 1, followed by a change in master clock enable input signal C from 0 to 1. Once C goes from 0 to 1, the internal AND gate 1706 of the L1GATER places a 1 on the data input pin of the flop 1702 (with the output of NAND gate 1704 remaining high due to the ZC output being low). This sets up the L1GATER to detect the first rising pulse of the system clock E so as to deactivate the "gating off" of the next master latch clock pulse following the first slave latch clock pulse in the test latch.

Accordingly, as shown in the launch/capture (L/C) sequence column of FIG. 20, the control signal inputs C, ASSTLOS1 and ASSTLOS2 are at 1 immediately following scan, while the system clock input E is at 0. The resulting ZC output of L1GATER is 0, meaning the master latch clock (e.g., MPG in FIG. 13) is gated off at this point in time. As indicated by arrow 2002 of FIG. 20 (and consistent with the timing diagram of FIG. 15), the first positive edge of master clock signal E changes the output ZC of L1GATER from 0 to 1, temporarily deactivating the gate off function thereof. It also triggers the slave latch L2 of the MPG structure 1200 (FIG. 14).

Since the output of ZC is fed back to the NAND gate 1704 and since ASSTLOS remains at 1 during launch/capture, the output of NAND gate 1704 goes low, meaning a 0 is now coupled to the data input of the flop 1702. In the next portion of the launch/capture operation, the system clock signal E returns to 0 (as also reflected at $t_2$ of FIG. 14). Although the output ZC of L1GATER does not change during this transition, as flop 1702 is a positive edge flop in this example, the master latch L1 clock is triggered in MPG 1200. Then, upon the second rising pulse of system clock E as reflected by arrow 2004 of FIG. 20, the output ZC of L1GATER is once again set to 0, thus gating off the master latch clock of MPG. This second rising pulse of second system clock E also coincides with the second pulse of the slave latch L2 clock of MPG 1200. Finally, the system clock E return to 0, completing the L/C sequence, with the output ZC of L1GATER remaining at 0. The subsequent L/C to scan sequence is illustrated in the last column of FIG. 20, showing the sequential deactivation of control signals C, ASSTLOS1 and ASSTLOS2.

Figure 21B:
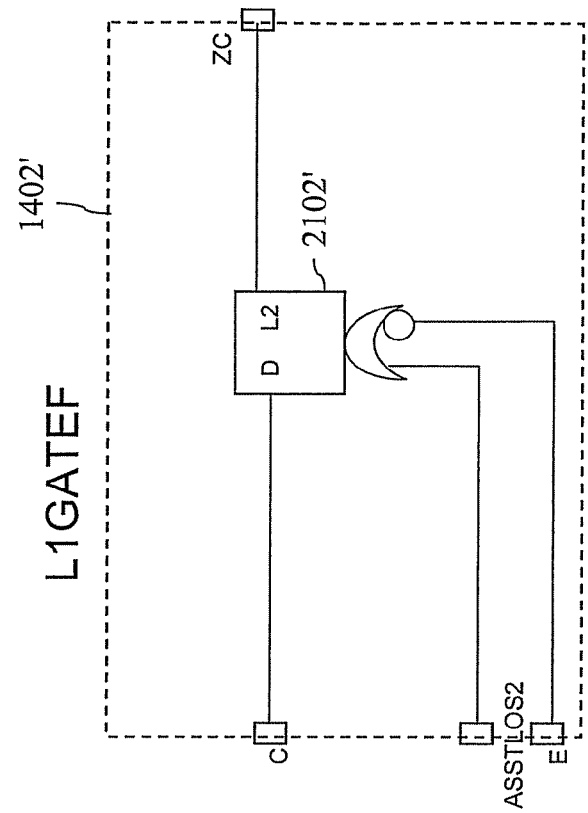
FIGS. 21(a) and 21(b) are schematic diagrams illustrating a simplified version of the local control circuit shown in FIGS. 19(a) and 19(b).
Figure 21A:
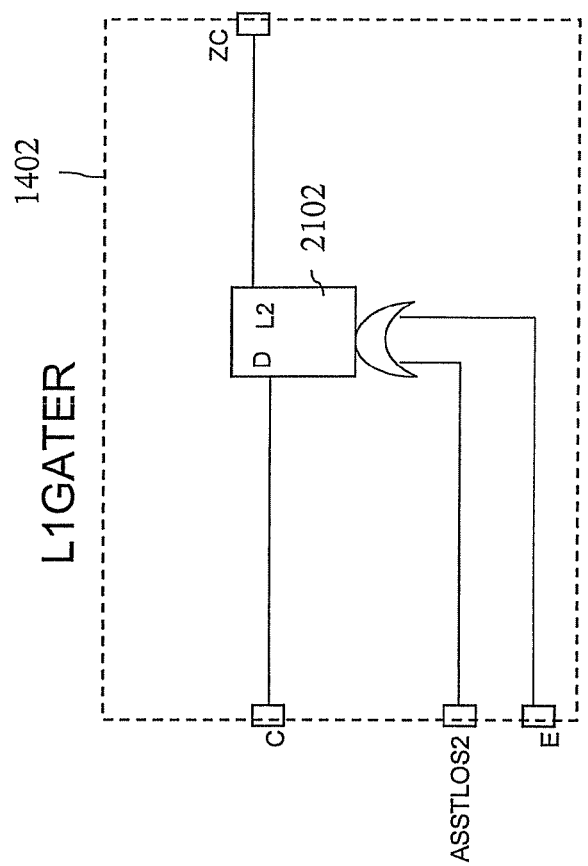

Finally, FIGS. 21(*a*) and 21(*b*) are schematic diagrams illustrating a simplified version of the local control circuit shown in FIGS. 19(*a*) and 19(*b*). As was the case for the clock splitter circuit of FIG. 4, the internal logic of local control circuits L1GATER/L1GATEF may also be simplified. In particular, FIGS. 21(*a*) and 21(*b*) illustrate the elimination of control signal ASSTLOS1, as well as the internal combinational logic feeding the data input of an edge triggered flop. Moreover, the two-stage, edge triggered flops 1702, 1702' (FIGS. 18(*a*), 18(*b*)) are also replaced with a simple latch 2102, 2102'. Since the ASSTLOS1 toggle function has been removed in this embodiment, the simple latch 2102, 2102' performs as a positive/negative edge triggered flop, respectively.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for selectively implementing launch-off-scan capability in at-speed testing of integrated circuit devices, comprising:
   a local clock splitting circuit that supplies a master clock signal and a slave clock signal to a Level Sensitive Scan Design (LSSD) latch structure under test, the local clock splitting circuit configured to selectively disable the master clock signal of the latch structure under test such that a pulse sequence of a system clock signal results in a slave-master-slave clock pulse sequence in the latch structure under test;
   the local clock splitting circuit further comprising a pair of AND gates and an edge-triggered latch coupled to inputs of the pair of AND gates, wherein the AND gates are respectively configured to selectively pass the master clock signal and the slave clock signal to the latch structure under test, depending upon an output state of the edge-triggered latch; and
   wherein the local clock splitting circuit utilizes the system clock signal as an input thereto and operates in a self-resetting fashion that is timing independent with respect to a scan chain.

2. The apparatus of claim 1, wherein the system clock signal pulses twice during a launch-off-scan operation, and wherein the master clock signal of the latch structure under test is gated off following a scan operation associated with launch-off-scan and prior to a first of the system clock signal pulses.

3. The apparatus of claim 2, wherein gating off of the master clock signal of the latch structure under test is suspended following a first of the system clock signal pulses.

4. The apparatus of claim 3, wherein gating off of the master clock signal of the latch structure under test is resumed following a second of the system clock signal pulses.

5. The apparatus of claim 1, wherein the edge-triggered latch comprises an L2 stage triggered by a first state of the system clock and an L1 stage triggered by a second state of the system clock.

6. The apparatus of claim 5, wherein SET and RESET operations of the edge-triggered latch are controlled through a plurality of control signals input to the local clock splitting circuit.

7. The apparatus of claim 6, wherein the local clock splitting circuit further comprises a delay block configured to prevent a race condition between the master clock signal and the slave clock signal.

8. A method of selectively implementing launch-off-scan capability in at-speed testing of integrated circuit devices, the method comprising:
   configuring a local clock splitting circuit that supplies a master clock signal and a slave clock signal to a Level Sensitive Scan Design (LSSD) structure tinder test to selectively disable the master clock signal of the latch structure under test such that a pulse sequence of a system clock signal results in a slave-master-slave clock pulse sequence applied to the latch structure under test;

the local clock splitting circuit further comprising a pair of AND gates and an edge-triggered latch coupled to inputs of the pair of AND gates, wherein the AND gates are respectively configured to selectively pass the master clock signal and the slave clock signal to the latch structure under test, depending upon an output state of the edge-triggered latch; and wherein the control device utilizes the system clock signal as an input thereto and operates in a self-resetting fashion that is timing independent with respect to a scan chain.

9. The method of claim 8, wherein the system clock signal pulses twice during a launch-off-scan operation, and wherein the master clock signal of the latch structure under test is gated off following a scan operation associated with launch-off-scan and prior to a first of the system clock signal pulses.

10. The method of claim 9, wherein gating off of the master clock signal of the latch structure under test is suspended following a first of the system clock signal pulses.

11. The method of claim 10, wherein gating off of the master clock signal of the latch structure under test is resumed following a second of the system clock signal pulses.

12. The method of claim 8 wherein the edge-triggered latch comprises an L2 stage triggered by a first state of the system clock and an L1 stage triggered by a second state of the system clock.

13. The method of claim 12, wherein SET and RESET operations of the edge-triggered latch are controlled through a plurality of control signals input to the local clock splitting circuit.

14. The method of claim 13, wherein the local clock splitting circuit further comprises a delay block configured to prevent a race condition between the master clock signal and the slave clock signal.

* * * * *